United States Patent
Shin

(10) Patent No.: US 9,768,114 B2
(45) Date of Patent: Sep. 19, 2017

(54) SEMICONDUCTOR DEVICE AND METHOD OF MANUFACTURING THE SAME

(75) Inventor: Yong Chul Shin, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 602 days.

(21) Appl. No.: 13/290,379

(22) Filed: Nov. 7, 2011

(65) Prior Publication Data

US 2012/0112362 A1 May 10, 2012

(30) Foreign Application Priority Data

Nov. 8, 2010 (KR) .................. 10-2010-0110389

(51) Int. Cl.
*H01L 23/528* (2006.01)
*H01L 23/522* (2006.01)

(52) U.S. Cl.
CPC ........ *H01L 23/528* (2013.01); *H01L 23/5226* (2013.01); *H01L 2924/0002* (2013.01)

(58) Field of Classification Search
CPC .......................... H01L 23/528; H01L 23/5226
USPC ........................................................ 257/774
See application file for complete search history.

(56) References Cited

U.S. PATENT DOCUMENTS

| 6,040,615 A * | 3/2000 | Nagai et al. .................. 257/529 |
| 2007/0280012 A1* | 12/2007 | Obayashi et al. ............ 365/200 |
| 2012/0032266 A1* | 2/2012 | Inoue .................. H01L 21/0337 257/365 |

FOREIGN PATENT DOCUMENTS

| KR | 1020060126859 | 12/2006 |
| KR | 1020070019245 | 2/2007 |
| KR | 1020090014003 | 2/2009 |

OTHER PUBLICATIONS

"Non-Volatile Memories for Removable Media", 2009 IEEE.*
Notice of Allowance issued by the Korean Intellectual Property Office on Aug. 20, 2012.

* cited by examiner

*Primary Examiner* — Brett Feeney
*Assistant Examiner* — Nga Doan
(74) *Attorney, Agent, or Firm* — IP & T Group LLP

(57) ABSTRACT

A semiconductor device includes a first line pattern and a second line pattern formed in parallel on a semiconductor substrate, third line patterns formed in parallel between the first line pattern and the second line pattern, fourth line patterns formed in parallel between the first line pattern and the second line pattern, a first connection structure configured to couple a first of the third line patterns with a first of the fourth lines patterns, which are adjacent to the first line pattern, and a second connection structure configured to couple a second of the first lines patterns with a second of the fourth lines patterns, which are adjacent to the second line pattern.

4 Claims, 9 Drawing Sheets

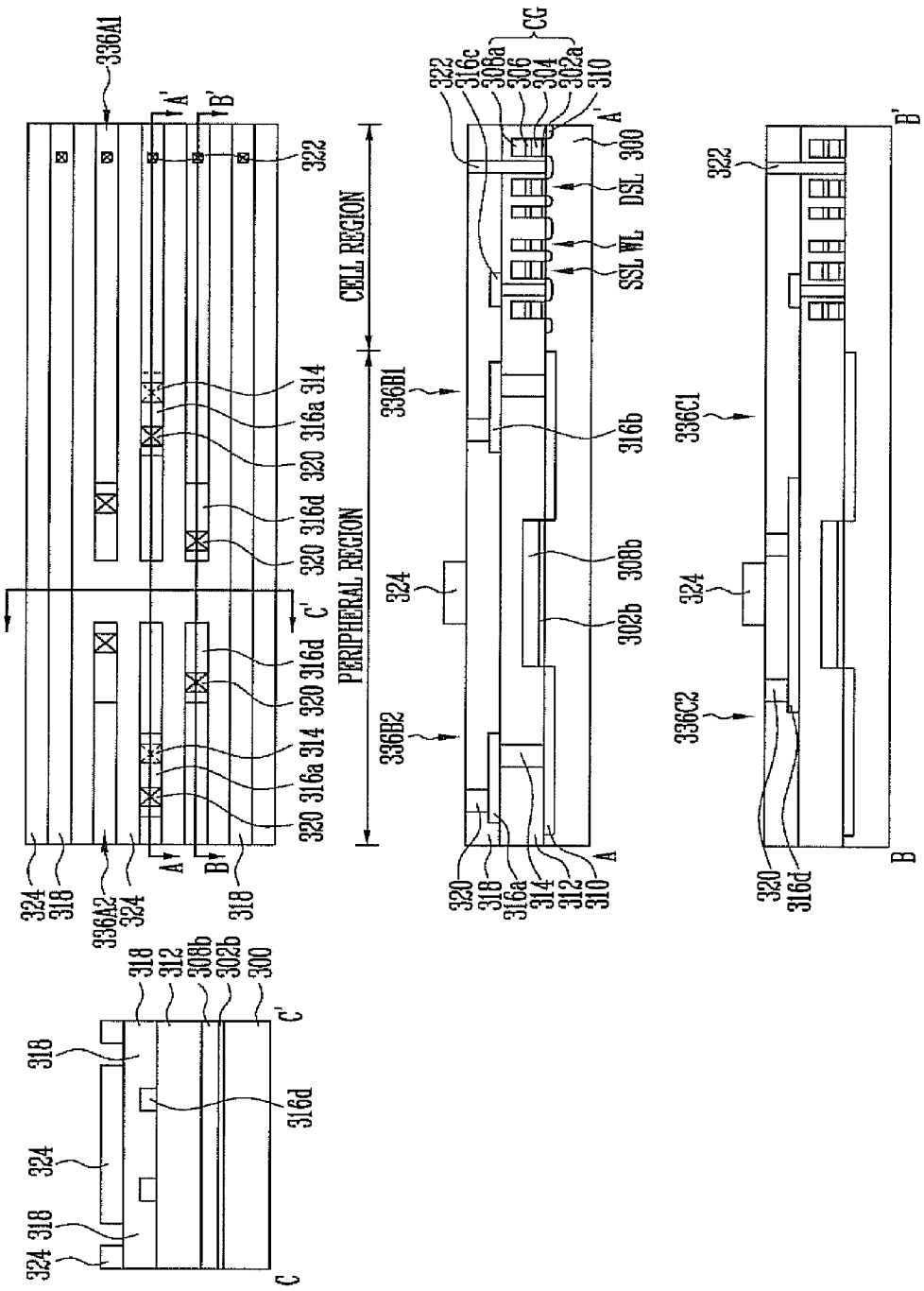

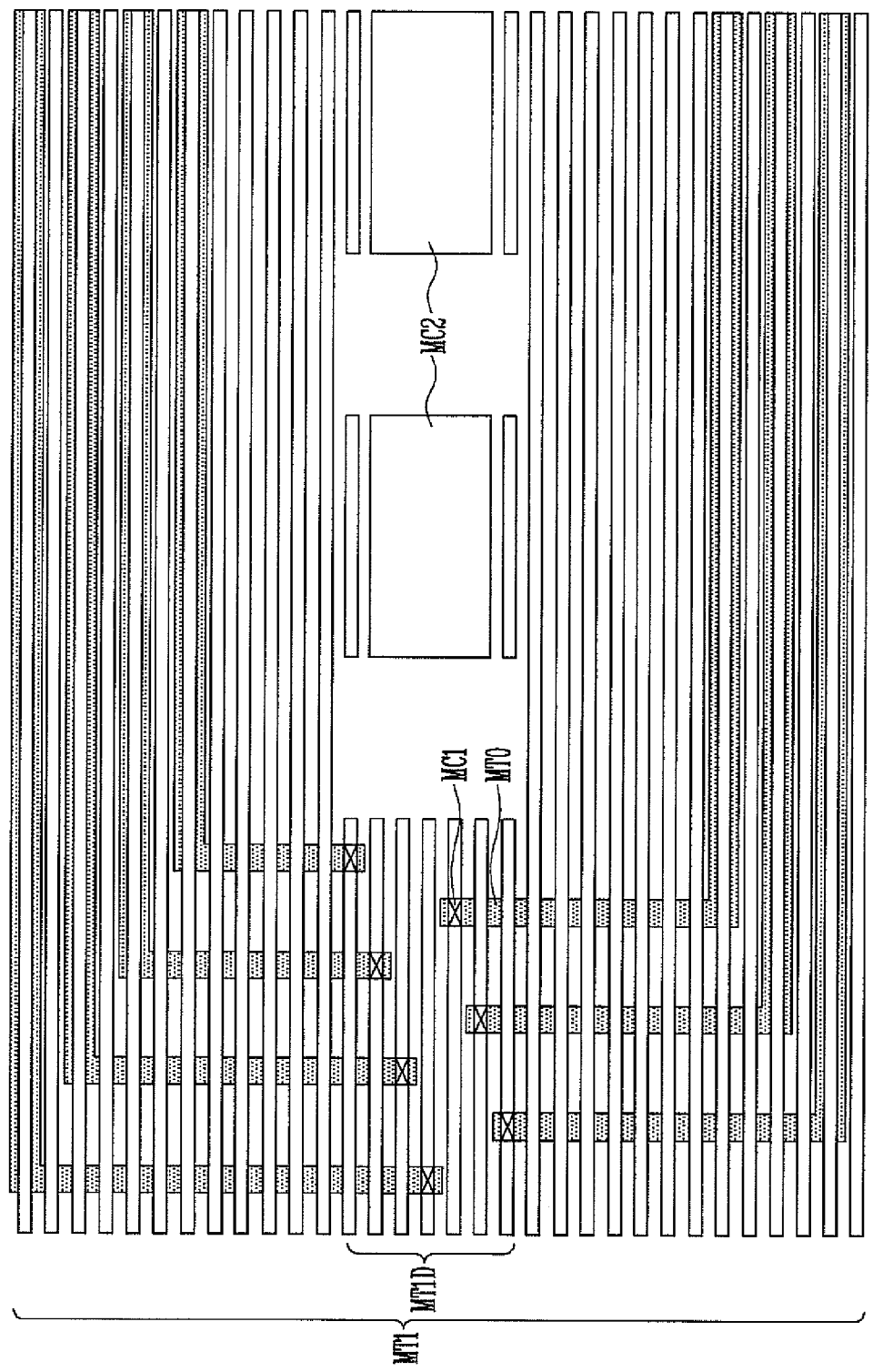

SEMICONDUCTOR DEVICE AND METHOD OF MANUFACTURING THE SAME

CROSS-REFERENCE TO RELATED APPLICATION

Priority to Korean patent application number 10-2010-0110389 filed on Nov. 8, 2010, the entire disclosure of which is incorporated by reference herein, is claimed.

BACKGROUND

Exemplary embodiments relate to a semiconductor device and a method of manufacturing the same and, more particularly, to a semiconductor device of fine patterns and a method of manufacturing the same.

In order to increase the degree of integration of semiconductor devices, the width of each of patterns of the semiconductor devices is narrowed, and an interval/space between the patterns (for example, etch mask patterns or conductive patterns) is also be narrowed. A minimum distance between the patterns is determined by the resolution of exposure equipment.

Therefore, a double patterning method for forming patterns having the minimum distance of the exposure equipment therebetween and for additionally forming a pattern between the formed patterns is being developed for the fine patterns of the semiconductor device. For example, through use of the double patterning method, patterns may be formed at half the minimum distance of the exposure equipment.

If patterns are formed using the double patterning method, the patterns are formed as lines in parallel. Furthermore, some of the patterns, i.e., lines, are to be etched at the center so that they are disconnected. There are, however, it is difficult to selectively etch only one pattern because an interval/space between the patterns is so narrow that peripheral patterns may also be etched.

BRIEF SUMMARY

According to exemplary embodiments, fine patterns may be selectively disconnected or connected by simultaneously etching a pattern, selected from among a plurality of patterns, and patterns neighboring the selected pattern and coupling the neighboring patterns, disconnected by the etching, using wiring placed over or under the disconnected neighboring patterns. Furthermore, the utilization of fine patterns may be increased by using all patterns (that is, through being disconnected and divided into two or more patterns) in a process of manufacturing a semiconductor device.

A semiconductor device according to an aspect of this disclosure includes a first line pattern and a second line pattern formed in parallel on a semiconductor substrate, third line patterns formed in parallel between the first line pattern and the second line pattern, fourth line patterns formed in parallel between the first line pattern and the second line pattern, a first connection structure configured to couple a first of the third line patterns with a first of the fourth lines patterns, which are adjacent to the first line pattern, and a second connection structure configured to couple a second of the first lines patterns with a second of the fourth lines patterns, which are adjacent to the second line pattern.

A method of manufacturing a semiconductor device according to another aspect of this disclosure includes: forming first to fourth via plugs in first to fourth wire regions of a semiconductor substrate, respectively, wherein the first and second wire regions are on a line and parallel to the third and fourth wire regions, respectively, and bottoms of the third and fourth via plugs are coupled through a first conductive pad; forming a third interlayer dielectric layer on the entire structure including the first via plug to the fourth via plug; forming a first etch mask pattern including first auxiliary patterns and second auxiliary patterns which are alternately placed on the third interlayer dielectric layer as a line type and expose the third interlayer dielectric layer of the first wire region to the fourth wire region; forming a second etch mask pattern over the third interlayer dielectric layer and the first etch mask pattern between the first wire region and the second wire region and between the third wire region and the fourth wire region; forming a first trench to a fourth trench through which the first via plug to the fourth via plug are exposed, respectively, by etching the third interlayer dielectric layer of the first wire region to the fourth wire region using the first etch mask pattern and the second etch mask pattern; and forming a first wire to a fourth wire coupled to the first via plug to the fourth via plug, respectively, within the first to fourth trenches.

A method of manufacturing a semiconductor device according to yet another aspect of this disclosure includes: forming a first via plug and a second via plug in a first wire region and a second wire region of a semiconductor substrate, respectively, wherein the first and second wire regions are on a line and parallel to the third and fourth wire regions, respectively; forming a third interlayer dielectric layer on the entire structure including the first via plug and the second via plug; forming a first etch mask pattern including first auxiliary patterns and second auxiliary patterns which are alternately placed on the third interlayer dielectric layer as a line type and exposing the third interlayer dielectric layer of the first wire region to the fourth wire region; forming a second etch mask pattern over the third interlayer dielectric layer and the first etch mask pattern between the first wire region and the second wire region and between the third wire region and the fourth wire region; forming a plurality of trenches, including a first trench and a second trench through which the first via plug and the second via plug are exposed, respectively, by etching the third interlayer dielectric layer of the first wire region to the fourth wire region using the first etch mask pattern and the second etch mask pattern; forming a plurality of wires, including a first wire and a second wire coupled to the first via plug and the second via plug, respectively, within the plurality of trenches; forming a fourth interlayer dielectric layer on the entire structure including the plurality of wires and forming a third via plug and a fourth via plug coupled to a third wire and a fourth wire, which are formed in the third wire region and the fourth wire region, among the plurality of wires, by penetrating through the fourth interlayer dielectric layer; and forming a first conductive pad for coupling the third via plug and the fourth via plug.

BRIEF DESCRIPTION OF THE DRAWINGS

FIGS. 3A to 3D are diagrams illustrating a method of manufacturing the semiconductor device according to an exemplary embodiment of this disclosure;

FIG. 5 is a plan view of a method of manufacturing the semiconductor device according to another exemplary embodiment of this disclosure.

DESCRIPTION OF EMBODIMENTS

Hereinafter, some exemplary embodiments of the present disclosure will be described in detail with reference to the accompanying drawings. The figures are provided to enable those of ordinary skill in the art to make and use the embodiments of the disclosure.

Figure 1:
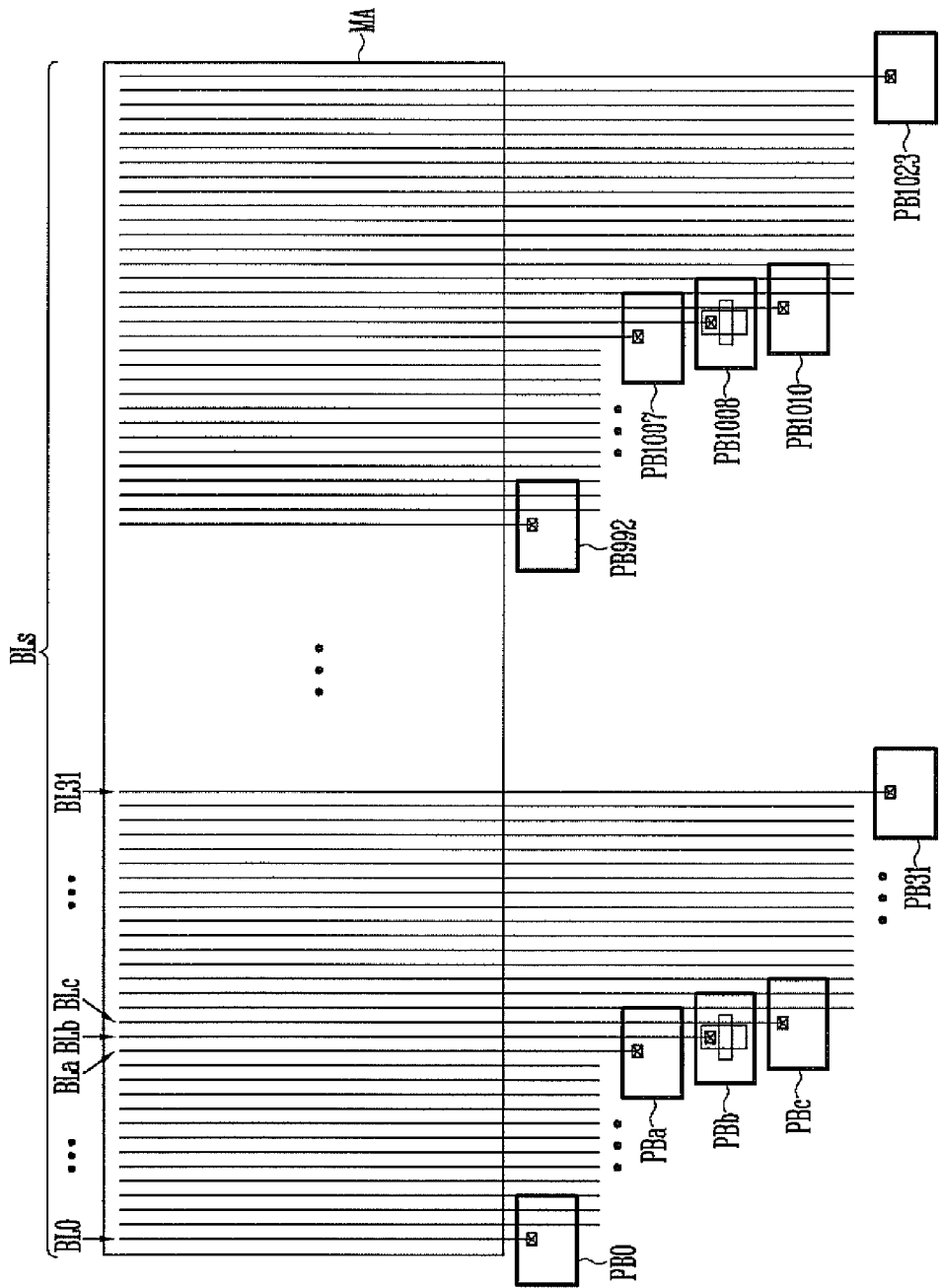
FIG. 1 is a block diagram illustrating a semiconductor device according to an exemplary embodiment of this disclosure.

FIG. 1 is a block diagram illustrating a semiconductor device according to an exemplary embodiment of this disclosure.

Referring to FIG. 1, in a process of fabricating a semiconductor device, a plurality of line patterns may be formed in parallel. The line patterns are mainly used to couple memory cells and peripheral circuits (for example, sense circuits or page buffers) in a memory device. An example that line patterns are used as the bit lines of a NAND flash memory device is described below.

In a memory array MA, memory cells are arranged in a column direction and a row direction. The memory cells arranged in the row direction are coupled to the same word line (not shown), and the memory cells arranged in the column direction are coupled to the same bit line.

In order to increase the degree of integration of memory devices, the size of the memory cell may be reduced, and a distance between the bit lines may also be narrowed. The distance between the bit lines is determined by the resolution of exposure equipment. For this reason, it is difficult to form the bit lines within the distance defined by exposure equipment.

However, a double patterning method of further narrowing the distance between the bit lines is being developed. A method of forming fine patterns using the double patterning method is described later. If the double patterning method is used, bit lines may be formed at the distance narrower than that defined by exposure equipment.

Several thousands of the bit lines are provided, and pairs of the bit lines, each including an even bit line and an odd bit line adjacent to each other, are coupled to respective page buffers PB0 to PB1023. In some embodiments, one page buffer may be coupled to one bit line. Furthermore, the page buffers PB0 to PB1023 may be placed under the memory array MA or may be divided into two groups and placed in upper and lower sides.

Meanwhile, since the size of the page buffer is large, the page buffers may not be arranged in a row in a direction crossing the bit lines (that is, a row direction or a word line direction). For this reason, the page buffers may be classified into several groups. For example, first page buffers PB0 to PB992 of respectively groups may be placed in a first line which is the closest to the memory array MA, and second page buffers PB1 to PB993 of the respective groups may be placed in a second line distant than the first line from the memory array MA.

If 32 page buffers PB0 to PB31 are included in one group, last page buffers PB31 to PB1023 of the respective groups are placed in a $32^{nd}$ line which is the farthest from the memory array MA. As described above, the page buffers PB0 to PB1023 are regularly arranged in an oblique line by a predetermined number. Furthermore, page buffers PBa and PBc adjacent to a page buffer PBb are arranged in different lines so that they go crisscross by a distance between adjacent bit lines BLa, BLb, and BLc.

The size of the page buffer is great over the several bit lines. Thus, the bit line BLb coupled to the page buffer PBb passes through the page buffer PBa which is placed closer to the memory array MA. Although the page buffers are reduced in size for the description purpose, 32 or more bit lines BL0 to BL31 may pass through one page buffer PBb or the high voltage transistor of a page buffer because the interval/space between the bit lines is narrow and the size of the page buffer is large.

The bit lines BLs have a very narrow interval therebetween because they are formed by the double patterning method. Accordingly, in an etch process for disconnecting the bit line BLb in a portion coupled to the page buffer PBb, it is difficult to selectively etch only the bit line BLb. In other words, if the bit line BLb is etched, peripheral bit lines BLa and BLc may also be etched and disconnected.

The bit lines BLs may be formed by using a damascene method of forming trenches in an insulating layer and filling the trenches with conductive material. The trenches, defining regions where the bit lines will be formed, may be formed through a process of etching the insulating layer using an etch mask which is formed by the double patterning method in order to narrow the interval between the bit lines.

In order to disconnect a specific portion of the bit line, the etch process is to be performed so that the trench is cut in the portion where the bit line is disconnected. In this case, it is difficult to form the etch mask in order to cut only one trench because the trenches are formed using the double patterning method. In other words, since the etch mask for cutting the trench also influences peripheral trenches, that neighboring trenches may be also cut in the process of etching the insulating layer for forming the trench to be cut.

Meanwhile, according to the double patterning method, it is difficult to form the bit lines having different lengths. Since all the bit lines BLs are formed to have the same length, the bit line which couples the memory cell with the page buffer closer than others has a certain portion irrelevant to the coupling. The portions of bit lines may be used as the wires of other transistors.

A method of manufacturing a semiconductor device is described below.

Figure 2A:
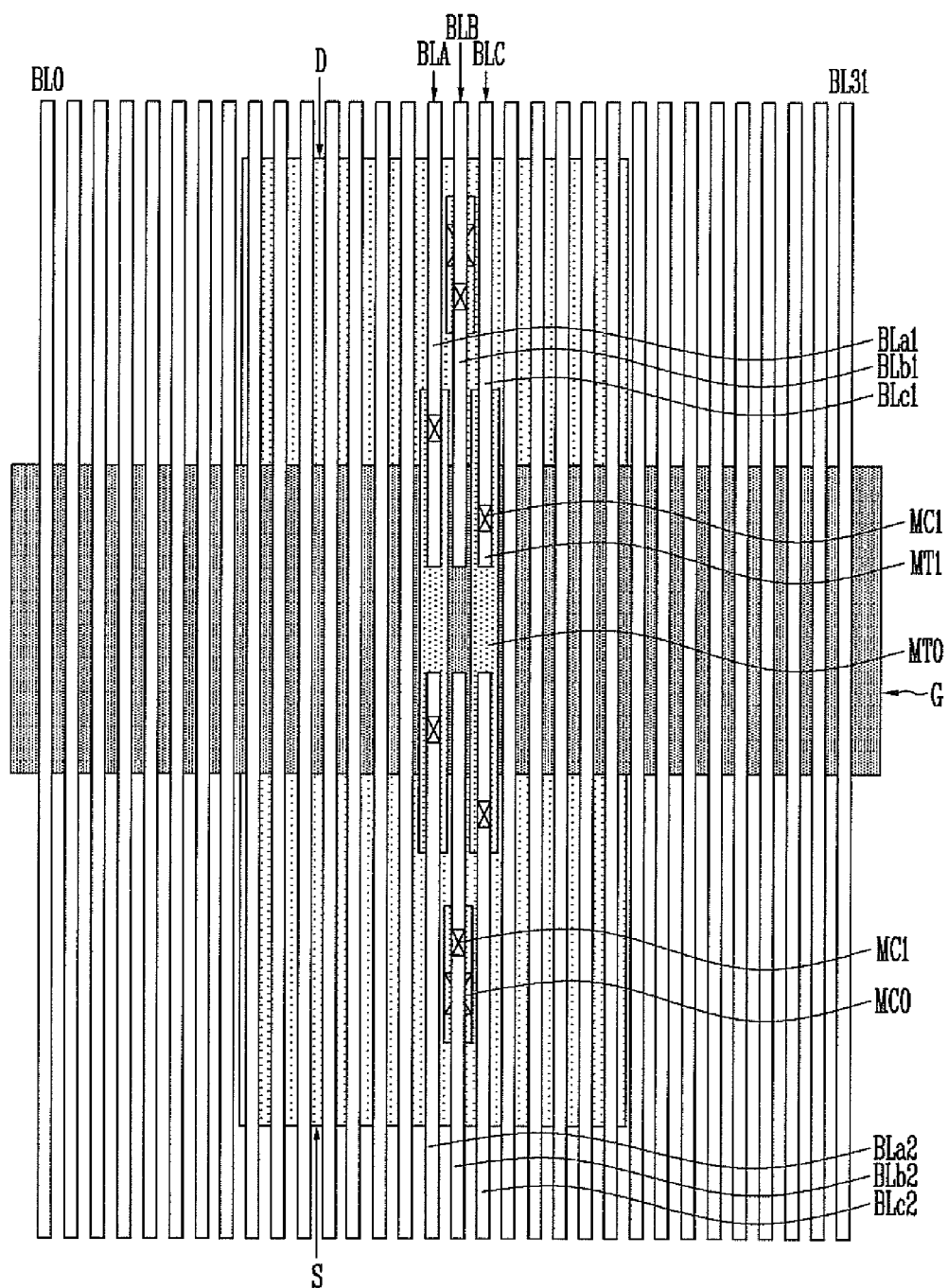
FIGS. 2A and 2B are diagrams illustrating a semiconductor device according to an exemplary embodiment of this disclosure.
Figure 2B:
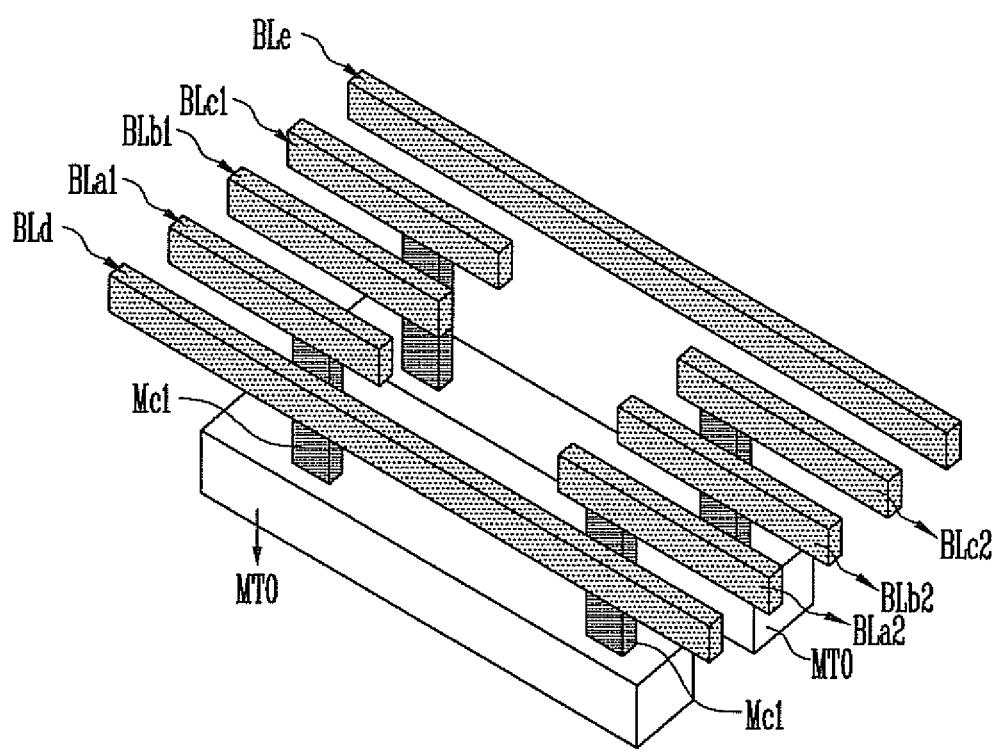

FIGS. 2A and 2B are diagrams illustrating a semiconductor device according to an exemplary embodiment of this disclosure.

Referring to FIGS. 2A and 2B, a transistor, including a gate G, a source S, and a drain D, is formed. The transistor may belong to a page buffer PBb to be directly coupled to a bit line BLb1. If the transistor is a high voltage transistor, wires BL0 to BL31 for numerous bit lines pass through the upper portion of the transistor because the size of the transistor is large.

A wire BLB of the wires BL0 to BL31 is used as the bit line BLb1 for coupling memory cells and the drain region D of the transistor. In order to use a desired part of the wire BLB as the bit line BLb1 for coupling the memory cells and the drain region D, the wire BLB for the bit line is formed so that an unnecessarily extended part BLb2 is cut.

The bit line BLb1 is coupled to the drain region D through an upper contact plug MC1, a lower wire MT0, and a lower contact plug MC0. Furthermore, the cut part BLb2 of the wire BLB may be used as a wire for coupling another semiconductor device and the source region S of the transistor through the upper contact plug MC1, the lower wire MT0, and the lower contact plug MC0.

It is difficult to only cut the wire BLB because an interval between the wires is narrow. For this reason, three or more wires BLA, BLB, and BLC are cut at the same time.

For example, if a wire or the bit line BLB is formed so that it is cut, wires or the bit lines BLA and BLC adjacent to the wire or the bit line BLB on both sides are also formed so that they are cut. Next, the cut wires BLa1, BLa2, BLc1, and BLc2 are coupled using the upper contact plugs MC1 and the lower wire MT0. Lower wires MT0 may be formed to have a wider width and a wider interval than upper wires BL0 to BL31. The lower wires MT0 may be formed in a process of forming the wires of peripheral elements. For example, the lower wires MT0 may be formed when forming the conductive pad of a source contact plug formed between the source select lines. This is described in detail later.

The structure is described below. First and second wires BLd and BLe are formed in parallel on a semiconductor substrate. A first wire group, including a plurality of third wires BLa1, BLb1, and BLc1 formed in parallel, is placed between the first and the second wires BLd and BLe. Furthermore, a second wire group, including a plurality of fourth wires BLa2, BLb2, and BLc2 formed in parallel, is placed between the first and the second wires BLd and BLe.

The first connection wire structures Mc1 and MT0 for coupling the third wire BLa1 of the first wire group and the fourth wire BLa2 of the second wire group, which are adjacent to the first wire BLd, respectively, are formed under the first and the second wire groups. Furthermore, the second connection wire structures Mc1 and MT0 for coupling the third wire BLc1 of the first wire group and the fourth wire BLc2 of the second wire group, which are adjacent to the second wire BLd, respectively, are formed under the first and the second wire groups.

More particularly, the first and the second connection wire structures include a first via plug Mc1 formed between the semiconductor substrate and the third wire BLa1 or BLc1 and coupled to the third wire BLa1 or BLc1 at the top and a second via plug Mc1 formed between the semiconductor substrate and the fourth wire BLa2 or BLc2 and coupled to the fourth wire BLa2 or BLc2 at the top, respectively, and they further include the first conductive pad MT0 for coupling the bottoms of the first and the second via plugs Mc1 and Mc1.

Meanwhile, the transistor is formed in the semiconductor substrate. Furthermore, third connection wire structures (refer to 314, 316a, 318, and 320 of FIG. 3A) for coupling the source of the transistor and the third wire BLb1 of the first wire group, which is not adjacent to the first and the second wires BLd and BLe, and fourth connection wire structures (refer to 314, 316b, 318, and 320 of FIG. 3A) for coupling the drain of the transistor and the fourth wire BLb2 of the second wire group, which is not adjacent to the first and the second wires BLd and BLe, may be further included.

A method of manufacturing the semiconductor device, having the above configuration, according to an embodiment of this disclosure is described below.

FIGS. 3A to 3D are diagrams illustrating the method of manufacturing the semiconductor device according to the exemplary embodiment of this disclosure.

Figure 3A:
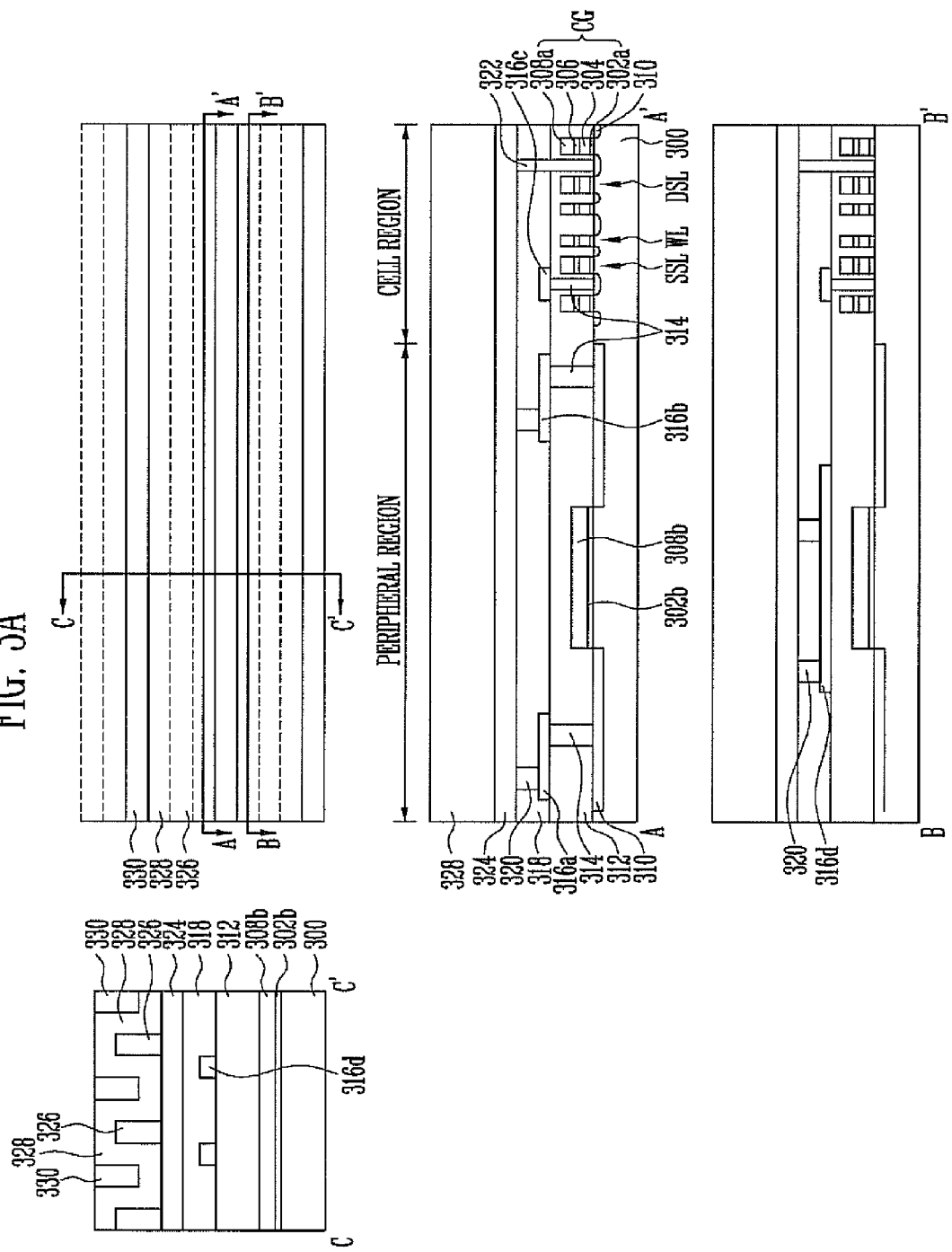

Referring to FIG. 3A, there are shown a plan view of the semiconductor device and its cross-sectional views taken along respective lines A-A', B-B', and C-C' of the plan view. For example, a NAND flash device is described below.

Memory cells are formed in a cell region, and peripheral circuits, such as page buffers, are formed in a peripheral region. The transistor of a page buffer, coupled to the memory cells through bit lines, is shown in the peripheral region, for example.

More particularly, cell gates CG, each including a tunnel dielectric layer 302a, a floating gate 304, a dielectric layer 306, and a control gate 308a, are formed on the cell region of the semiconductor substrate 300. The gates of the memory cells form word lines WL, the gate of a source select transistor forms a source select line SSL, and the gate of a drain select transistor forms a drain select line DSL. A junction 310 is formed in the semiconductor substrate 300 between the lines WL, SSL, and DSL. The arrangement of the lines DSL, WL, and SSL and the junctions, of the NAND flash memory device, is well known, and a detailed description thereof is omitted.

Meanwhile, transistors for forming the page buffers are formed on the peripheral region of the semiconductor substrate 300. Among the transistors, only the transistor of a page buffer directly coupled to a bit line is shown. The transistor may be a high voltage transistor, and it includes a gate insulating layer 302b, a gate 308b, and the junction 310 to be use as a source and a drain.

A first interlayer dielectric layer 312 is formed over the semiconductor substrate in which the memory cells and the transistors are formed. Next, contact holes for exposing the junction 310 between the source select lines SSL (that is, the source of the source select transistor) and the junction 310 of the peripheral region are formed. Lower contact plugs 314 are formed in the respective contact holes. In the cell region, the lower contact plug 314 formed between the source select lines SSL is a source contact plug and may be formed in a line fashion parallel to the source select line SSL between the source select lines SSL.

Lower metal wires 316a to 316d to be used as the conductive pads are formed over the semiconductor substrate 300 including the lower contact plug 314. The lower metal wire 316c is coupled to the source contact plug 314 and is formed to increase the contact area of the source contact plug 314 with an upper contact plug formed in a subsequent process. The lower metal wires 316a, 316b, and 316d are also formed in the peripheral region. The lower metal wires 316a and 316b are formed to cut specific wires and to couple the cut wires and the source and the drain of the transistor in a subsequent process. Furthermore, neighboring wires are also cut when the specific wires are cut. The lower metal wire 316d is used as means for coupling the neighboring wires again.

A second interlayer dielectric layer 318 is formed on the entire structure including the lower metal wires 316a to 316d. Next, the second interlayer dielectric layer 318 is selectively etched in order to form contact holes through which the junction 310 between the drain select lines DSL is exposed and contact holes through which the lower metal wires 316a, 316b, and 316d of the peripheral region are exposed. Next, via plugs 320 and a bit line contact plug 322 are formed within the contact holes. The bit line contact plug 322 is coupled to the drain of the drain select transistor between the drain select lines DSL. The lower metal wire 316d is formed to couple a cut wire, and thus the two via plugs 320 are formed on the lower metal wire 316d.

Here, a first wire plan region (refer to 336B1 of FIG. 3C) and a second wire plan region (refer to 336B2 of FIG. 3C) are defined in a line in the semiconductor substrate. A third wire plan region (refer to 336C1 of FIG. 3C) is defined in parallel to the first wire plan region (refer to 336B1 of FIG. 3C). In particular, third wire plan regions (refer to 336A1 and 336C1 of FIG. 3C) may be defined on both sides of the first wire plan region (refer to 336B1 of FIG. 3C). Furthermore, a fourth wire plan region (refer to 336C2 of FIG. 3C) is defined in parallel to the second wire plan region (refer to 336B2 of FIG. 3C). In particular, fourth wire plan regions (refer to 336A2 and 336C2 of FIG. 3C) may be defined on both sides of the second wire plan region (refer to 336B2 of FIG. 3C).

The first and the second via plugs 320 are formed in the first and the second wire plan regions, respectively, and the third and the fourth via plugs 320 are formed in the third and the fourth wire plan regions, respectively.

A target etch layer 324 is formed on the entire structure, including the via plugs 320 and the bit line contact plug 322. The target etch layer 324 may be formed of conductive material for forming the bit lines or of insulating material for forming a third interlayer dielectric layer. An example that the target etch layer 324 is used as a third interlayer dielectric layer 324 is described below. Next, trenches for defining regions where the wires for the bit lines will be formed are formed in the third interlayer dielectric layer 324. In order to form the trenches each having a narrow width, an etch mask used in an etch process is formed using the double patterning method. This is described in detail below.

First auxiliary patterns 326 are formed on the third interlayer dielectric layer 324 in parallel as a line type. The first auxiliary patterns 326 are formed to have a minimum interval that may be defined by exposure equipment therebetween.

A sacrificial layer 328 is formed on the surface of the first auxiliary patterns 326 and on the surface of the third interlayer dielectric layer 324. It is preferred that the thickness of the sacrificial layer 328 formed on the sidewalls of the first auxiliary patterns 326 be equal to the width of the first auxiliary patterns 326. Accordingly, spaces defined by the sacrificial layer 328 are formed between the first auxiliary patterns 326, and second auxiliary patterns 330 are formed within the spaces. It is preferred that the second auxiliary patterns 330 be made of the same material as the first auxiliary patterns 326. The second auxiliary pattern 330 has the same width as the first auxiliary pattern 326. The second auxiliary patterns 330 are self-aligned on the sacrificial layer 328 between the first auxiliary patterns 326 in a line fashion in parallel to the first auxiliary patterns 326. A region between the first and the second auxiliary patterns 326 and 330 corresponds to a region where a trench will be formed, that is, a region where the wires for the bit lines will be formed).

Figure 3B:
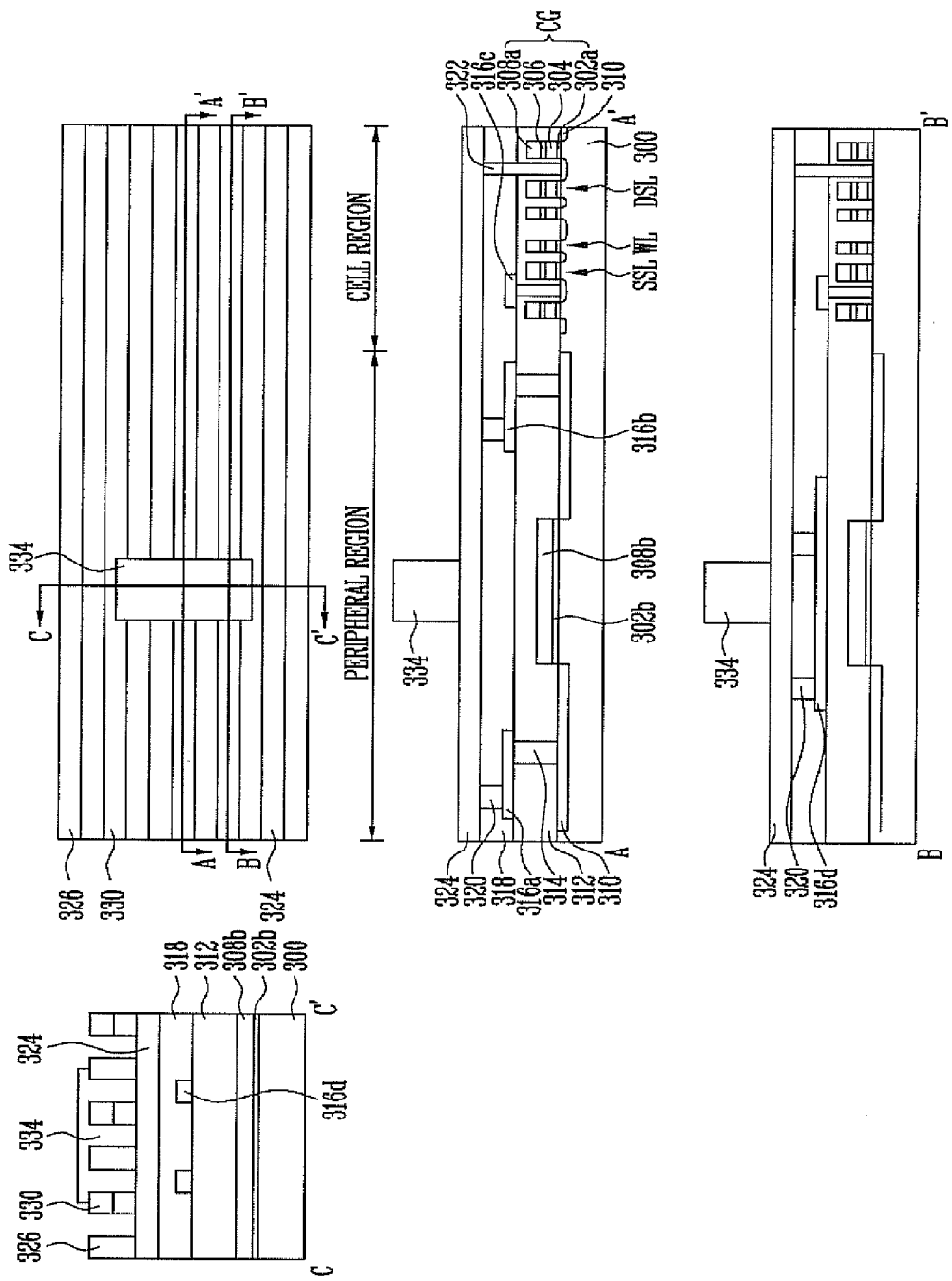

Referring to FIG. 3B, the sacrificial layer 328 between the first and the second auxiliary patterns 326 and 330 is removed. The sacrificial layer 328 on the upper portion of the first auxiliary pattern 326 is also removed. The first and the second auxiliary patterns 326 and 330 remain intact when the sacrificial layer 328 is removed because the sacrificial layer 328 and the first and the second auxiliary patterns 326 and 330 are made of different materials. Furthermore, the sacrificial layer 328 remains only under the second auxiliary pattern 330.

Accordingly, the first etch mask patterns, including the first auxiliary patterns 326 and the second auxiliary patterns 330 alternately arranged on the third interlayer dielectric layer 324 as a line type and exposing the first wire plan region to the fourth wire plan region, are formed as parallel lines with a minimum interval narrower than an interval that may be defined by exposure equipment therebetween.

Next, a second etch mask pattern 334 is formed in each region where wires will be disconnected (that is, a region where the trench of a line type will be filled). The second etch mask pattern 334 is formed over the first etch mask patterns 326 and 330 and the third interlayer dielectric layer 320 placed between the first wire plan region and the second wire plan region and between the third wire plan region and the fourth wire plan region.

The second etch mask pattern 334 may be formed when an etch mask for an etch process is formed in another region (not shown) of the peripheral region. In this case, the second etch mask pattern 334 may not be formed by additional processes (for example, an exposure process and a patterning process). The second etch mask pattern 334 may be formed corresponding to the number of page buffers (or sense circuits), but it is shown corresponding to only one buffer for the description purpose.

Meanwhile, the second etch mask pattern 334 is formed in a portion where the wire and the page buffer are coupled as described in FIG. 1. Accordingly, the distance between the second etch mask pattern 334 and the memory array is equal to the distance between the page buffers and the memory array. The second etch mask pattern 334 is formed not only over a specific trench region, but also over neighboring trench regions of the specific trench region. For example, the second etch mask pattern 334 may be formed to cover two of the first auxiliary patterns 326 and two of the second auxiliary patterns 330.

Therefore, the second etch mask pattern 334 may be formed over the gate 308b of the transistor coupled to the wire. Accordingly, the wires are disconnected over the gate 308b, and two of the disconnected wires are coupled to the source and the drain of the transistor, respectively. Furthermore, since wires adjacent to the two wires are also disconnected, a lower metal wire 316d for coupling the disconnected wires is formed over the gate. This is described in detail below.

Referring to FIG. 3C, trenches 336A1, 336A2, 336B1, 336B2, 336C1, and 336C2 are formed by etching the third interlayer dielectric layer 324 using an etch process using the first and the second etch mask patterns 326, 330, and 334. The trenches 336A1, 336A2, 336B1, 336B2, 336C1, and 336C2 are formed at narrow intervals in the first to the fourth wire plan regions as a line type. Furthermore, the trenches 336A1, 336A2, 336B1, 336B2, 336C1, and 336C2 are formed to end at the region where the second etch mask pattern 334 is formed. Meanwhile, the upper contact plugs 320 and the bit line contact plug 322 are exposed through the trenches 336A1, 336B1, and 336C1, and the upper contact plugs 320 are exposed through the trenches 336A2, 336B2, and 336C2.

Figure 3D:
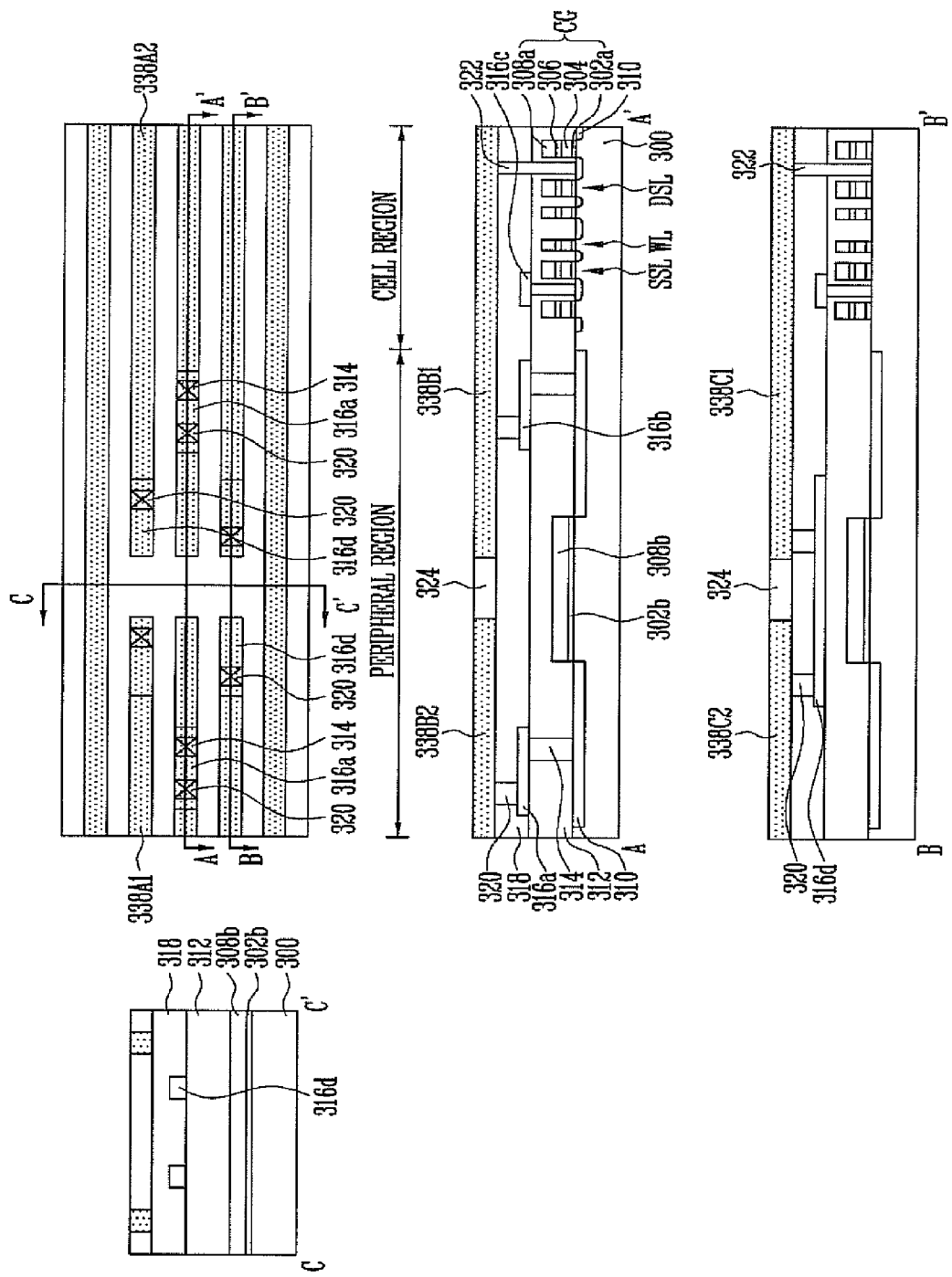

Referring to FIG. 3D, wires 338A1, 338A2, 338B1, 338B2, 338C1, and 338C2 are formed within the trenches 336A1, 336A2, 336B1, 336B2, 336C1, and 336C2. The wires 338A1, 338A2, 338B1, 338B2, 338C1, and 338C2 are also formed at narrow intervals in parallel as a line type the same as the shapes of the trenches 336A1, 336A2, 336B1, 336B2, 336C1, and 336C2. Furthermore, the wires 338A1, 338A2, 338B1 are disconnected from the wires 338B2, 338C1, and 338C2, respectively, by the third interlayer dielectric layer 324.

However, the wires 338A1 and 338A2 are interconnected by the upper contact plug 320 and the lower metal wire 316d, and the wires 338C1 and 338C2 are interconnected by the upper contact plug 320 and the lower metal wire 316d. Furthermore, the wires 338B1 and 338B2 are coupled to the source and the drain 310 of the transistor, respectively, through the upper contact plug 320, the lower metal wires 316a and 316b, and the lower contact plug 314.

In order to couple the neighboring wires 338A1, 338A2, 338C1, and 338C2 as described above, coupling pads 316d are to be formed under the area where the neighboring wires 338A1, 338A2, 338C1, and 338C2 are disconnected. The lower contact plugs 320 are to be placed before the wires 338A1, 338A2, 338B1, 338B2, 338C1, and 338C2 are formed so that the wires 338A1, 338A2, 338C1, and 338C2 may be coupled to the coupling pads 316d.

Furthermore, it is preferred that the coupling pads 316a and 316b for coupling the respective wires 338B1 and 338B2 to the source and the drain 310 be formed over the source and the drain 310. It is preferred that the coupling pads 316d for coupling the disconnected wires 338A1, 338A2, 338C1, and 338C2 be formed over the gate 308b.

Accordingly, the wire 338B1 is used as a bit line for coupling the memory array and the transistor of a page buffer (or a peripheral circuit), and the remaining wire 338B2 may be used as a wire for coupling the transistor and another transistor of a page buffer (or a peripheral circuit).

Although the third interlayer dielectric layer is formed as the target etch layer 324, a conductive layer for forming the bit lines may be formed as the target etch layer 324.

In this case, the first etch mask patterns 326 and 330 covers the regions where the wires 338A1, 338A2, 338B1, 338B2, 338C1, and 338C2 are formed. The second etch mask patterns 334 are formed to expose regions where the wires 338A1, 338A2, 338B1, 338B2, 338C1, and 338C2 are disconnected (that is, the regions where the second etch mask patterns are formed in FIG. 3B). After the wires 338A1, 338A2, 338B1, 338B2, 338C1, and 338C2 are formed by etching the target etch layer using the etch process using the first and the second etch mask patterns, spaces between the wires 338A1, 338A2, 338B1, 338B2, 338C1, and 338C2 are filled with an insulating layer (for example, the third interlayer dielectric layer).

Figure 4:
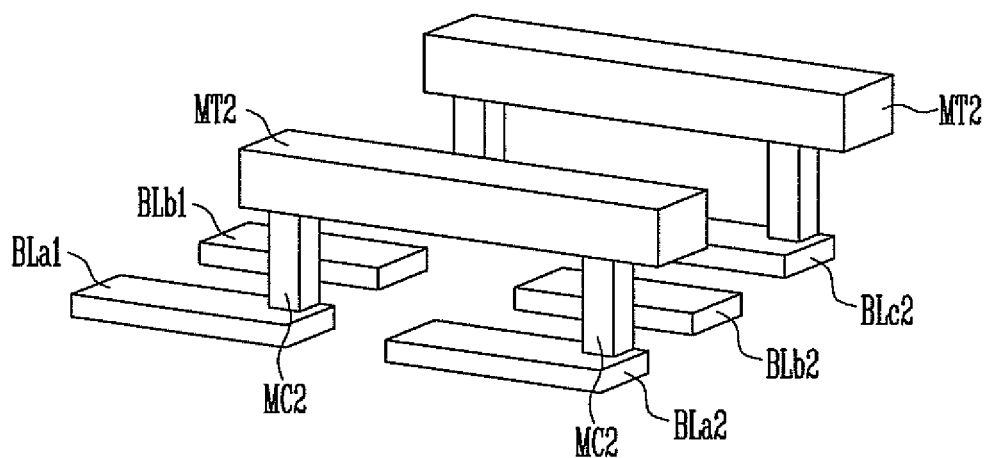
FIG. 4 is a perspective view illustrating the structure of a semiconductor device according to another exemplary embodiment of this disclosure.

FIG. 4 is a perspective view illustrating the structure of a semiconductor device according to another exemplary embodiment of this disclosure.

Referring to FIG. 4, after wires BLa1, BLa2, BLb1, BLb2, BLc1, and BLc2 are formed using the same method as that described above, the wires BLa1 and BLc1 may be coupled with the wires BLa2 and BLc2 using via plugs MC2 and conductive pads MT2 formed over the wires. The via plugs MC2 and conductive pads MT2 may be formed when a process of forming the wires of peripheral circuits is performed, that is, without additional processes.

According to the above structure, a first wire group, including a plurality of third wires BLa1, BLb1, and BLc1 formed in parallel, may be placed between first and second wires (refer to BLd and BLe of FIG. 2B) formed in parallel on a semiconductor substrate. Furthermore, a second wire group, including a plurality of fourth wires BLa2, BLb2, and BLc2 formed in parallel, may be placed between the first and the second wires BLd and BLe.

First connection wire structures Mcg and MT2 for coupling the third wire BLa1 of the first wire group and the fourth wire BLa2 of the second wire group which are adjacent to the first wire BLd are formed over the first and the second wire groups. In other words, the first connection wire structures MC2 and MT2 are placed over the first and the second wire groups to couple the third wire BLa1 with the fourth wire BLa2, which are placed on one side of the first and second wire groups, respectively.

Furthermore, second connection wire structures Mc2 and MT2 for coupling the third wire BLc1 of the first wire group and the fourth wire BLc2 of the second wire group which are adjacent to the second wire BLd are formed over the first and the second wire groups. In other words, the second connection wire structures Mc2 and MT2 are placed over the first and second wire groups to couple the third wire BLc1 with the fourth wire BLc2, which are placed on the other side of the first and second wire groups, respectively.

More particularly, the first connection wire structure or the second connection wire structure may include a first via plug MC2 formed on the third wire BLa1 or BLc1, a second via plug MC2 formed on the fourth wire BLa2 or BLc2, and a first conductive pad MT2 formed to couple the tops of the first and the second via plugs MC2.

Meanwhile, a transistor is formed in a semiconductor substrate. Furthermore, third connection wire structures (refer to 314, 316a, and 320 of FIG. 3A) for coupling the source of the transistor and the third wire BLb1 of the first wire group which is not adjacent to the first and the second wires BLd and BLe and fourth connection wire structures (refer to 314, 316b, and 320 of FIG. 3A) for coupling the drain of the transistor and the fourth wire BLb2 of the second wire group which is not adjacent to the first and the second wires BLd and BLe may be further provided.

In the above, regions where the first and the second via plugs MC2 and the first conductive pad MT2 are formed may correspond to the regions where the via plugs 320 and the first conductive pad 316d are formed in FIG. 3A.

FIG. 5 is a plan view of a method of manufacturing the semiconductor device according to another exemplary embodiment of this disclosure.

Referring to FIG. 5, if the wires MT1 are formed using the above-described double patterning method, the wires MT1 are formed in parallel as a line type at dense intervals. Accordingly, the wires MT1 pass through the upper portions of other semiconductor devices, such as transistors formed in a substrate. In order to couple the wires and other semiconductor devices or supply power to other semiconductor devices, the contact plugs MC2 are to be formed. Accordingly, the wires MT1D are formed so that they are disconnected in the regions where the contact plugs MC2 are formed. The disconnected parts of the wires MT1D may be used as wires for coupling other semiconductor devices through the lower contact plugs MC1 and the lower wires MT0.

According to this disclosure, a pattern, selected from among a plurality of patterns, and patterns neighboring the selected pattern are etched at the same time, and the neighboring patterns disconnected by the etching are coupled using wires placed over or under the disconnected neighboring patterns. Accordingly, fine patterns may be selectively disconnected or connected. Furthermore, the utilization of fine patterns may be increased by using all patterns, disconnected and divided into two or more patterns, in a process of manufacturing a semiconductor device.

What is claimed is:

1. A semiconductor device, comprising:
    a first line pattern and a second line pattern formed in parallel over a semiconductor substrate;
    third line patterns formed in parallel between the first line pattern and the second line pattern;
    fourth line patterns formed in parallel between the first line pattern and the second line pattern;
    a first connection structure configured to couple a first of the third line patterns with a first of the fourth line patterns, which are adjacent to the first line pattern; and
    a second connection structure configured to couple a second of the third line patterns with a second of the fourth line patterns, which are adjacent to the second line pattern, wherein the first of the third line patterns and the second of the third line patterns are parallel, the first of the third line patterns and the first of the fourth line patterns are collinear, one end of the first of the third line patterns and one end of the first of the fourth line patterns are structurally separated to be spaced apart from each other and coupled to the first connection structure, and the other end of the first of the third line patterns and the other end of the first of the fourth line patterns extend in opposite directions to each other, and extension directions are in parallel with the semiconductor substrate.

2. The semiconductor device of claim 1, wherein the first connection structure comprises:

a first via plug formed between the semiconductor substrate and the first of the third line patterns and coupled to the first of the third line patterns at the top thereof;

a second via plug formed between the semiconductor substrate and the first of the fourth line patterns and coupled to the first of the fourth line patterns at the top thereof; and a first conductive pad configured to couple bottoms of the first and second via plugs, wherein the second connection structure comprises:

a third via plug formed between the semiconductor substrate and the second of the third line patterns and coupled to the second of the third line patterns at the top thereof;

a fourth via plug formed between the semiconductor substrate and the second of the fourth line patterns and coupled to the second of the fourth line patterns at the top thereof; and a second conductive pad configured to couple bottoms of the third and fourth via plugs.

3. The semiconductor device of claim 1, wherein the first connection structure comprises:

a first via plug formed on the first of the third line patterns;

a second via plug formed on the first of the fourth line patterns; and a first conductive pad configured to couple tops of the first and second via plugs, wherein the second connection structure comprises: a third via plug formed on the second of the third line patterns;

a fourth via plug formed on the second of the fourth line patterns; and a second conductive pad configured to couple tops of the third and fourth via plugs.

4. The semiconductor device of claim 1, further comprising:

a transistor formed in the semiconductor substrate;

a third connection structure configured to couple a source of the transistor and a third of the third line patterns which is formed between the first and second of the third line patterns; and a fourth connection structure configured to couple a drain of the transistor and a third of the fourth line patterns which is formed between the first and second of the fourth line patterns.

* * * * *